United States Patent
Frueh et al.

(10) Patent No.: US 9,177,934 B2
(45) Date of Patent: Nov. 3, 2015

(54) CONNECTION ARRANGEMENT OF AN ELECTRIC AND/OR ELECTRONIC COMPONENT

(71) Applicant: Robert Bosch GmbH, Stuttgart (DE)

(72) Inventors: Christiane Frueh, Ludwigsburg (DE); Andreas Fix, Stuttgart (DE)

(73) Assignee: Robert Bosch GmbH, Stuttgart (DE)

(*) Notice: Subject to any disclaimer, the term of this patent is extended or adjusted under 35 U.S.C. 154(b) by 0 days.

(21) Appl. No.: 14/377,895

(22) PCT Filed: Jan. 25, 2013

(86) PCT No.: PCT/EP2013/051400
§ 371 (c)(1),
(2) Date: Aug. 11, 2014

(87) PCT Pub. No.: WO2013/117438
PCT Pub. Date: Aug. 15, 2013

(65) Prior Publication Data
US 2015/0014865 A1 Jan. 15, 2015

(30) Foreign Application Priority Data
Feb. 9, 2012 (DE) .......................... 10 2012 201 935

(51) Int. Cl.
*H01L 23/00* (2006.01)
(52) U.S. Cl.
CPC ................ *H01L 24/30* (2013.01); *H01L 24/27* (2013.01); *H01L 24/29* (2013.01); *H01L 24/32* (2013.01); *H01L 24/83* (2013.01);
(Continued)

(58) Field of Classification Search
None
See application file for complete search history.

(56) References Cited

U.S. PATENT DOCUMENTS

| 4,835,445 | A | 5/1989 | Watanabe et al. |
| 6,144,104 | A * | 11/2000 | Baker et al. .................. 257/783 |

(Continued)

FOREIGN PATENT DOCUMENTS

| DE | 102004058878 | 6/2006 |
| JP | 59066131 | 4/1984 |
| JP | 10135249 | 5/1998 |

OTHER PUBLICATIONS

International Search Report for Application No. PCT/EP2013/051400 dated Aug. 14, 2013 (English Translation, 4 pages).

*Primary Examiner* — Erik Kielin
(74) *Attorney, Agent, or Firm* — Michael Best & Friedrich LLP

(57) ABSTRACT

The connection arrangement (100, 200, 300, 400) comprises at least one electric and/or electronic component (1). The at least one electric and/or electronic component (10) has at least one connection face (11), which is connected in a bonded manner to a join partner (40) by means of a connection layer (20). The connection layer (20) can for example be an adhesive, soldered, welded, sintered connection or another known connection that connects joining partners while forming a material connection. Furthermore, a reinforcement layer (30') is arranged adjacent to the connection layer (20) in a bonded manner. The reinforcement layer (30') has a higher modulus of elasticity than the connection layer (20). A particularly good protective effect is achieved if the reinforcement layer (30') is formed in a frame-like manner by an outer and an inner boundary (36, 35) and, at least with the outer boundary (36) thereof, encloses the connection face (11) of the at least one electric and/or electronic component (10).

14 Claims, 1 Drawing Sheet

(52) U.S. Cl.
CPC ............... *H01L 2224/26125* (2013.01); *H01L 2224/26155* (2013.01); *H01L 2224/27013* (2013.01); *H01L 2224/2732* (2013.01); *H01L 2224/30515* (2013.01); *H01L 2224/32013* (2013.01); *H01L 2224/32014* (2013.01); *H01L 2224/32225* (2013.01); *H01L 2224/32245* (2013.01); *H01L 2224/32507* (2013.01); *H01L 2224/8384* (2013.01); *H01L 2224/8392* (2013.01); *H01L 2224/83101* (2013.01); *H01L 2224/83192* (2013.01); *H01L 2224/83194* (2013.01); *H01L 2224/83801* (2013.01); *H01L 2224/83825* (2013.01); *H01L 2224/83948* (2013.01); *H01L 2224/83951* (2013.01); *H01L 2924/01327* (2013.01); *H01L 2924/10253* (2013.01); *H01L 2924/1203* (2013.01); *H01L 2924/1304* (2013.01); *H01L 2924/1305* (2013.01); *H01L 2924/13055* (2013.01); *H01L 2924/13091* (2013.01); *H01L 2924/14* (2013.01); *H01L 2924/15747* (2013.01); *H01L 2924/3512* (2013.01)

(56) References Cited

U.S. PATENT DOCUMENTS

| | | |
|---|---|---|
| 2009/0051016 A1 | 2/2009 | Galesic et al. |
| 2010/0187678 A1 | 7/2010 | Kajiwara et al. |
| 2011/0084384 A1 | 4/2011 | Sakata et al. |
| 2011/0303448 A1* | 12/2011 | Anderson et al. ............ 174/259 |
| 2013/0049204 A1* | 2/2013 | Oeschler et al. ............ 257/772 |

* cited by examiner

CONNECTION ARRANGEMENT OF AN ELECTRIC AND/OR ELECTRONIC COMPONENT

BACKGROUND OF THE INVENTION

The invention relates to a connection arrangement of at least one electric and/or electronic component comprising a join partner, composite element and a method for configuring the connection arrangement.

In many areas of technology, electronic components, such as, e.g., integrated circuits (IC), transistors or diodes are used within electrical circuit arrangements. A variety of electronic components are hereby fixed to a base part, e.g. substrate or something similar. The electronic components are fixed, for example, to the base part by means of a connection layer, such as, e.g., an adhesive, solder or sintered layer. Due to the difference between ambient, joining and operating temperature, the rigidity of the connection layer and the distinctly different expansion coefficients of, for example, IC and substrate, very high mechanical or thermomechanical stresses can however occur in the electronic components. As a result, thermal stresses can lead to a so-called "clam-shell marked fracture" on the electronic component, wherein partial regions of the surface of the electronic component have broken away. This can lead to a very short service life of such electronic assemblies.

In order to reduce the occurrence of mechanical stresses within the electronic component, it is known to introduce round depressions, so-called dimples, into the substrate surface around the region of the fixed electronic component. The substrate is now more elastic in this region on account of the round depressions; thus enabling mechanical stresses resulting from differing expansion coefficients of the substrate, the connection layer and the electronic component to already be broken down in the region of the substrate enclosed by the round depressions.

The introduction of the dimples entails an additional manufacturing step in providing the substrate.

An arrangement of a semiconductor chip on a metal substrate is known from the first publication of the American patent application US 2010/0187678 A1. The semiconductor chip is thereby attached to the metal substrate at low pressure by means of sintering a silver paste. In addition, the semiconductor chip has bonded connections which connect said semiconductor chip to contacting points. The arrangement previously described together with the bonded connections is completely coated from the outside with a metal oxide coating (SnO, AlO). The arrangement coated in this manner is furthermore encapsulated by a polymer material. The metal oxide coating achieves a stress reduction for the semiconductor chip. Such a coating is expensive because it must be applied to the entire arrangement. Furthermore, the application of the coating to the arrangement as a spatial entity is difficult and entails effort and expense. In addition, only methods can be used in which regions adjacent to the arrangement can be omitted from such a coating.

SUMMARY OF THE INVENTION

The aim of the invention is to design a connection arrangement of an electric and/or electronic component such that the component, in particular a semiconductor chip, can be used during operation in a manner resistant to temperature fluctuations, in particular within a circuit arrangement of a motor vehicle.

It is further the aim of the invention to specify a method for configuring such a connection arrangement.

These aims are met by a connection arrangement of at least one electric and/or electronic component and furthermore by a composite element for configuring the connection arrangement as well as by a method for producing the same according to the invention.

The connection arrangement comprises at least one electric and/or electronic component. The at least one electric and/or electronic component has at least one connection face, which is connected in a bonded manner to a join partner by means of a connection layer. The connection layer can, for example, be an adhesive, soldered, welded, sintered connection or another known connection that connects joining partners by means of forming a material connection.

A distinguishing characteristic for the connection arrangement according to the invention is that a reinforcement layer is arranged adjacent to the connection layer in a bonded manner. To this end, the reinforcement layer has a higher modulus of elasticity than the connection layer. In so doing, a crack formation in the connection layer can advantageously be prevented, which occurs in otherwise known connection arrangements as a result of mechanical and/or thermomechanical stresses, in particular when temperature fluctuations due to operating conditions occur. This effect is explained by the fact that a material having a high elasticity module can be very resistant to material deformation. The reinforcement layer therefore prevents a supercritical expansion of the connection layer or of the at least one electric and/or electronic component connected to the connection layer. A particularly good protective effect is achieved if the reinforcement layer is formed in a frame-like manner by an outer and an inner boundary and, at least with the outer boundary thereof, encloses the connection face of the at least one electric and/or electronic component.

In a frame-like manner refers in this context in particular to the fact that the reinforcement layer, due to the outer and/or inner boundary thereof, has a closed circumferential course at least in one plane, in particular in a plane substantially parallel to the connection face of the at least one electric and/or electronic component. The outer and/or inner boundary runs preferably for the most part parallel to the outer contour of the connection face. The connection face can have besides a square or rectangular base also a base that is annular, oval or shaped otherwise. It is particularly advantageous if the reinforcement layer is embodied free of interruptions. As a result, inherently different expansions of the at least one electric and/or electronic component, of the connection layer and of the join partner, for example a carrier substrate, can be suppressed by the connection layer. By means of the frame-like configuration, the reinforcement layer acts like a rigid belt which can absorb forces and at the same time does not permit any deformations.

Provision is made in an advantageous embodiment of the connection arrangement according to the invention for the connection layer to have a surface region which protrudes beyond the connection face of the at least one electric and/or electronic component. In an advantageous manner, the reinforcement layer is disposed on the connection layer in said surface region. It is particularly advantageous if the reinforcement layer disposed on said region extends with the inner boundary thereof at least up to the connection face of the at least one electric an/or electronic component. It is furthermore advantageous if the reinforcement layer is designed in this arrangement at least in certain regions such that said reinforcement layer surrounds a housing of the at least one electric and/or electronic component at least above a minimum height.

Overall, the vulnerable edge region of the connection face as well as of the housing of the at least one electric and/or electronic component is thereby effectively protected from a crack initiation and/or crack expansion, for example as a result of temperature fluctuations due to operating conditions.

In an alternative or continuative embodiment of the connection arrangement according to the invention, the reinforcement layer delimits with the inner boundary thereof the lateral expansion of the connection layer. In so doing, the inner boundary of the reinforcement layer encloses the connection layer at least partially or preferably completely across the layer thickness thereof. A partial delimitation across the layer thickness of the connection layer can, for example, be embodied in such a manner that the reinforcement layer is arranged adjacent to the connection layer on the join partner and is embodied smaller in layer thickness than the connection layer. Furthermore, the reinforcement layer can be arranged within the connection layer at least partially in a spatially integrated manner. As a result, the side of the reinforcement layer facing in the direction of the connection face of the at least one electric and/or electronic component and/or the side of said reinforcement layer facing in the direction of the join partner are at least partially, preferably completely, covered by the connecting layer.

All in all, a further option which is improved in combination with the reinforcement layer arranged on the connection layer is thereby provided to effectively protect the vulnerable edge region of both the connection face and the housing of the at least one electric and/or electronic component from a crack initiation and/or crack expansion.

Provision is made in an advantageous modification to the connection arrangement according to the invention for the inner boundary of the reinforcement layer to extend partially—preferably completely—to within the connection face of the at least one electric and/or electronic component. In this case, the side of the reinforcement layer facing in the direction of the connection face of the at least one electric and/or electronic component and said connection face itself comprise an overlapping surface region. It is particularly advantageous if said connection face is connected in a bonded manner to the reinforcement layer in the overlapping region. In this way, the edge region of the connection face of the at least one electric and/or electronic component is directly fixed to the reinforcement layer so that the possibilities for the component to expand are as a whole limited to the small possibility for expansion of the reinforcement layer. As a result, the risk of a crack forming and expanding within the component is maximally reduced.

The reinforcement layer is preferably to be selected as a function of the selected connection layer. Care is therefore, for example, to be taken that a bonded connection can be formed between the connection layer and the reinforcement layer and also preferably between the connection face of the at least one electric and/or electronic component and/or the join partner. Mechanical and/or thermomechanical stresses which result from the different expansion behavior of the at least one electric and/or electronic component, the connection layer and the join partner can thereby be absorbed by the reinforcement layer. In order to meet this end, care furthermore must be taken that the reinforcement layer has a higher modulus of elasticity than the connection layer.

An advantageous modification to the connection arrangement according to the invention is provided by a reinforcement layer which comprises at least one intermetallic phase. Intermetallic phases have a high proportion of covalent bonds. This leads to a high modulus of elasticity and a higher melting or decomposition temperature, for example greater than 250EC, particularly 300EC and above. This is then particularly advantageous if the connection arrangement is exposed to high temperatures when joining the at least one electric and/or electronic component to the join partner or during operation. In this way, the reliability of the connection arrangement can be ensured even at high temperatures.

A preferred inventive connection arrangement comprises a connection layer, which includes at least one metal, for example a metallic sintered connection, in particular consisting of silver. In addition, the reinforcement layer is formed from a soldering material, in particular a tin-, bismuth-, zinc-, gallium- or aluminum-based soldering material, wherein, after the connection layer and/or the soldering material has been thermally treated, the reinforcement layer comprises at least one intermetallic phase or is formed from at least one metallic phase and thus replaces the former soldering material.

It is particularly advantageous if the connection layer, for example embodied as a sintered molded part, and the solder layer are configured in the form of a composite element, which is then disposed between the at least one electric and/or electronic component and the join element in order to form the connection arrangement according to the invention. In this regard, the solder layer is formed in a frame-like manner within the composite element and is arranged on the connection layer and/or arranged adjacent to the connection layer such that the inner boundary thereof delimits the lateral surface expansion of the connection layer. A particular advantage then becomes evident in that the composite element can be manufactured in advance in large quantities independently of the use within the a connection arrangement. In addition, an easy handling and an equipping comparable with each electric and/or electronic component are provided.

The thermal treatment is preferably based on the required soldering profile. On the whole, a very simple and cost effective option is thus provided, to form a temperature resistant, intermetallic phase by means of conventional connection materials and connection methods.

The connection arrangement according to the invention is particularly suited for semiconductor components, for example made of silicon, in particular comprising a planar connection face, for example IGBT, MOSFET, DIODEN and semiconductor chip. Such components are attached by means of the connection layer, for example, to a DBC substrate (direct copper bonded), a metallic lead frame, an organic or ceramic interconnect device or an IMS substrate (insulated metal substrate) as join partner. The connection layer, in particular as a sintered layer, preferably has a layer thickness of 10-500 µm, in particular 10-300 µm, particularly preferred 10-100 µm. The reinforcement layer can be embodied similarly to the connection layer in the layer thickness thereof. If a solder layer is selected as the reinforcement layer, which is to be replaced by at least one intermetallic phase in particular after a thermal treatment, smaller layer thicknesses are preferred, for example 0.5-100 µm, in particular 0.5-60 µm, particularly preferred 1 µm- 30 µm.

The method of the invention enables a crack formation and crack expansion within the connection layer and/or the at least one electric and/or electronic component to be counteracted in a simple and cost effective manner. In this regard, conventional connection materials can be used, which allow among other things the connection arrangement formed to be used at high operating temperatures.

BRIEF DESCRIPTION OF THE DRAWINGS

Further advantages, features and details of the invention ensue from the following description of preferred exemplary embodiments as well as with the aid of the drawings. In the drawings.

DETAILED DESCRIPTION

Figure 1A:
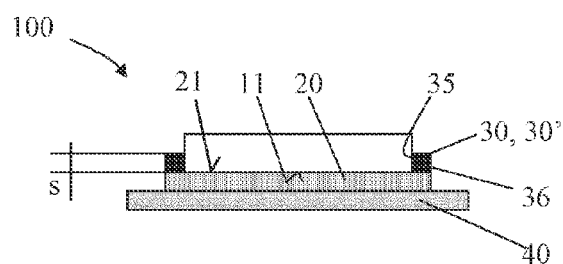
FIG. 1: shows schematically a first embodiment of the connection arrangement according to the invention in a side view.
FIG. 1b: shows schematically the embodiment from FIG. 1a in a top view.

In the figures, functionally identical components are denoted in each case with the same reference numerals.

Figure 1B:
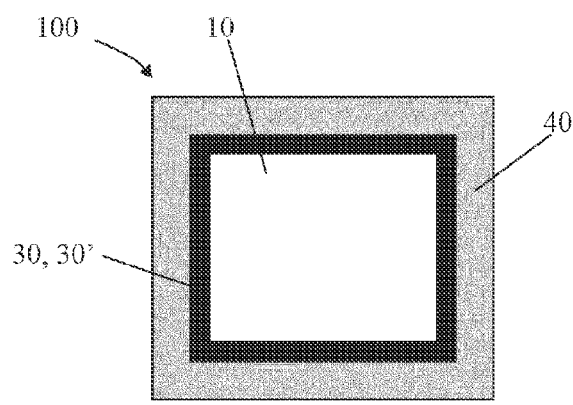

The FIGS. 1a and 1b show a first embodiment of the connection arrangement 100 according to the invention. In order to form the connection arrangement 100, a circuit substrate, for example a DBC substrate, is provided. A semiconductor chip 10 is connected in a bonded manner to the DBC substrate. To this end, the semiconductor chip 10 has a connection face 11 on the side facing the DBC substrate 40. The connection face 11 serves, for example, to electrically contact the semiconductor chip 10 and/or to cool the same. In order to form the bonded connection, a sintered layer 20 consisting of silver is disposed between the connection face 11 and the DBC substrate. For this purpose, the sintered layer 20 can, for example, be present in paste form and be applied to the DBC substrate 40 by means of know paste printing methods. The sintered layer 20 can likewise be formed as a sintered molded part and be applied to the DBC substrate 40 in a form that is then solid and fitted to the connection face 11. In the concrete exemplary embodiment, the sintered layer 20 is formed in such a manner that an upper surface region 21 facing the connection face 11 protrudes beyond said connection face 11 of the semiconductor chip 10. Said surface region 21 protrudes—as can be seen in the top view of FIG. 1b—generally on all sides with respect to the semiconductor chip 10. Furthermore, a tin-based solder layer 30—for example consisting of SnAg3.5 or of SnCu0.7—is applied to this surface region 21, said solder layer having a layer thickness s, for example of 50 μm. In this way, the solder layer 30 is formed having an inner boundary 35 and an outer boundary 36. The inner boundary 35 of the solder layer 30 extends in this instance to the connection face 11. In addition, the housing of the semiconductor chip 10 is surrounded on all sides by the solder layer 20 at the height of the layer thickness s.

The connection arrangement formed in this manner, in particular the sintered layer 20 and/or the solder layer 30, is subsequently thermally treated. The thermal treatment preferably occurs in the range of the melting temperature of the solder layer 30. In the case that the sintering temperature of the sintered layer 20 lies below the melting temperature of the solder layer 30, a sintering process is triggered as a result of the thermal treatment, whereby the semiconductor chip 10 is connected in a bonded manner to the DBC substrate 40 by means of the sintered layer 20. At the same time, solid body diffusion processes begin between the sintered layer 20 and the solder layer 30 as a result of the thermal treatment. In so doing, the metals and/or metal alloys of both layers 20, 30 mix at least in the boundary regions, i.e. within the surface region 21, and form a reinforcement layer 30', comprising at least one intermetallic phase. In the case of, for example, SnAg3.5 as solder material, Ag3Sn forms as the intermetallic phase. In the case of, for example, SnCu0.7 being the soldered material, Ag3Sn as well as Cu6Sn5 form as intermetallic phases.

By the solder layer 30 being embodied very thin, for example having a layer thickness of 50 μm, the metals and/or metal alloys of both layers 20, 30 diffuse very far into the solder layer 30. A duration of the thermal treatment is preferably selected, in which the solder layer 30 is substantially replaced by the formed, at least one intermetallic phase and in so doing totally forms the reinforcement layer 30'. For reasons of simplification, the fact is not depicted that the formed intermetallic phase also generally extends in certain regions into the sintered layer 20.

Figure 2A:
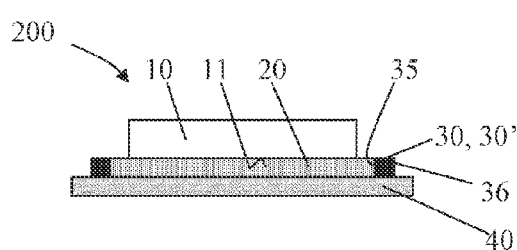
FIG. 2a: shows schematically a second embodiment of the connection arrangement according to the invention in a side view.
Figure 2B:
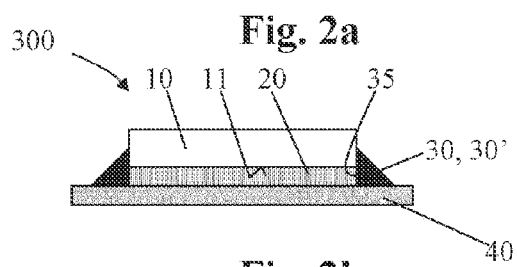
FIG. 2b: shows schematically a third embodiment of the connection arrangement according to the invention in a side view.
Figure 2C:
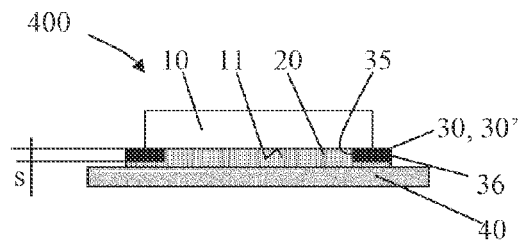
FIG. 2c: shows schematically a fourth embodiment of the connection arrangement according to the invention in a side view.

In the FIGS. 2a-2c, further exemplary embodiments of the inventive connection arrangement 200, 300, 400 are shown. They differ primarily in the arrangement of the solder layer 30 and the reinforcement layer 30' formed therefrom within the connection arrangement 200, 300, 400.

In the second embodiment of the inventive connection arrangement pursuant to FIG. 2a, the solder layer 30 is applied laterally adjacent to the sintered layer 20 on the DBC substrate. As a result, the reinforcement layer 30' formed after the thermal treatment joins in a bonded manner with the sintered layer 20 as well as with the DBC substrate. In addition, the inner boundary 35 delimits the lateral surface expansion of the sintered layer 20.

The third exemplary embodiment of the inventive connection arrangement 300 corresponding to FIG. 2b resembles the second embodiment. In contrast thereto, the sintered layer 20 in the third embodiment is substantially flush with the connection face 11 or with the housing of the semiconductor chip 10. In addition, the solder layer 30 is formed in the layer thickness thereof at least in the region of the housing of the semiconductor chip 10 in such a way that at least a minimum height of the housing is surrounded on all sides by a portion of the solder layer 30 or, respectively, (after the thermal treatment) then by the reinforcement layer 30'.

In the fourth exemplary embodiment of the inventive connection arrangement 400 pursuant to FIG. 2c, the solder layer 30 is integrated within the sintered layer 20. As a result, the side of the solder layer 30 facing the connection face 11 planarly closes with the sintered layer 20 which is bounded at least over the layer thickness s of the solder layer 30 by means of the inner boundary 35 thereof. Furthermore, the side of the solder layer 30 facing away from the connection face is covered by the sintered layer 20. After the thermal treatment, the formed reinforcement layer 30' joins in a bonded manner with the sintered layer 20 as well as with the surface region extending into the contact face 11.

Further embodiments are generally possible, which, for example, constitute a combination of or a modification to the embodiments previously described.

In addition, the solder layer can basically be applied and/or disposed even after formation of the bonded connection of the electric and/or electronic component, for example the semiconductor chip 10, to the join partner, for example to the DBC substrate.

The application of the solder layer 30 to the sintered layer 20 in the form of a sintered molded part or the lateral disposal of the solder layer 30 adjacent to the connection layer 20 such that the solder layer 30 delimits the lateral surface expansion of the connection layer 20 with the inner boundary 35 thereof can also take place already prior to formation of the connection arrangement 100, 200, 300, 400 by means of forming a composite element. In this case, the composite element is disposed between the at least one electric and/or electronic component, for example the semiconductor chip 10, and the join partner, for example the DBC substrate, and the thermal treatment for forming the reinforcement layer 30' is subsequently performed.

In principle, it is also possible to provide the connection layer 20 which comprises at least one metal as a solder layer, for example from a tin-, bismuth-, zinc-, gallium- or aluminum-based soft solder. The reinforcement layer 30' can likewise in general be formed from a metal layer, in particular one containing tin, silver, copper, zinc, bismuth, gallium and/or aluminum, said metal layer being applied, for example, by a chemical and/or physical coating procedure. In general, materials for the connection layer 20 and the reinforcement layer 30' can be selected such that the reinforcement layer 30' comprises at least on intermetallic phase due to a thermal treatment and the diffusion processes thereby taking place between both layers 20, 30.

The invention claimed is:

1. A connection arrangement (100, 200, 300, 400) of at least one electric and/or electronic component (10), wherein the at least one electric and/or electronic component (10) has a connection face (11), which is connected in a bonded manner to the join partner (40) by a connection layer (20),
characterized in that
a reinforcement layer (30') is arranged adjacent to the connection layer (20) in a bonded manner, said reinforcement layer having a higher modulus of elasticity than the connection layer (20), wherein the reinforcement layer (30') is formed in a frame-like manner by an outer boundary and an inner boundary (36, 35) and, at least with the outer boundary (36) thereof, encloses the connection face (11), wherein the connection layer (20) has a surface region (21) which protrudes beyond the connection face (11), wherein the reinforcement layer (30') is arranged on the connection layer (20) in said surface region (21),
wherein the connection layer (20) is a silver-sintered layer.

2. The connection arrangement (100, 200, 300, 400) according to claim 1, characterized in that the inner boundary (35) of the reinforcement layer (30') extends to within the connection face (11).

3. The connection arrangement according to claim 1, wherein the component is a semiconductor chip and the join partner (40) is a circuit carrier.

4. The connection arrangement (100, 200, 300, 400) according to claim 1, characterized in that the reinforcement layer (30') comprises at least one intermetallic phase.

5. The connection arrangement (100, 200, 300, 400) according to claim 1, characterized in that the connection layer (20) comprises at least one metal and the reinforcement layer (30') is formed from a soldering material (30), wherein, after a thermal treatment of at least one of the connection layer (20) and the soldering material (30), the reinforcement layer (30') comprises at least one intermetallic phase or is formed from at least one intermetallic phase.

6. The connection arrangement (100, 200, 300, 400) according to claim 1, characterized in that the connection layer (20) is a metal layer, which contains tin, silver, copper, zinc, bismuth, gallium and/or aluminum.

7. The connection arrangement according to claim 1, wherein the reinforcement layer (30') is formed from a tin-, bismuth-, zinc-, gallium- or aluminum-based soldering material.

8. A composite element for forming a connection arrangement (100, 200, 300, 400) according to claim 1, comprising a connection layer (20), which is a silver-sintered layer or a silver-sintered molded part, and a solder layer (30) arranged adjacent to the connection layer (20),
characterized in that
the solder layer (30) is formed in a frame-like manner by an outer boundary and an inner boundary (36, 35) and is arranged on at least one of the connection layer (20) and the solder layer (30), with the inner boundary (35) thereof, delimits a lateral surface expansion of the connection layer (20), wherein the composite element is designed in such a way that, during a thermal treatment of at least one of the connection layer (20) and the solder layer (30), a reinforcement layer (30') comprising at least one intermetallic phase is formed between the connection layer (20) and the solder layer (30) for preventing a crack formation within said connection layer (20) due to at least one of thermal and thermomechanical stresses, the reinforcement layer (30') having a higher modulus of elasticity than the connection layer (20), and wherein the connection layer (20) has a surface region (21) which protrudes beyond the connection face (11), wherein the reinforcement layer (30') is arranged on the connection layer (20) in said surface region (21).

9. The composite element according to claim 8, characterized in that after the thermal treatment, at least the solder layer (30) is substantially replaced by the reinforcement layer (30').

10. The composite element according to claim 8, characterized in that the solder layer (30) contains tin, bismuth, zinc, gallium and/or aluminum.

11. A joining method for forming a connection arrangement (100, 200, 300, 400) according to claim 1, wherein a connection layer (20) is disposed between the connection face (11) of at least one electric and/or electronic component (10) and a join partner (40) in order to form a bonded connection,
characterized in that
a reinforcement layer (30') is arranged adjacent to the connection layer (20), said reinforcement layer having a higher modulus of elasticity than the connection layer (20), wherein the reinforcement layer (30') is formed in a frame-like manner by an outer boundary and an inner boundary (36, 35) and the connection face (11) is enclosed by at least the outer boundary (36) of the reinforcement layer (30') wherein the connection layer (20) has a surface region (21) which protrudes beyond the connection face (11), and wherein the reinforcement layer (30') is arranged on the connection layer (20) in said surface region (21), and further characterized in that the connection layer (20) comprises at least one metal and the reinforcement layer (30') is formed from a solder layer (30), wherein the solder layer (30) is formed in a frame-like manner by the outer boundary and the inner boundary (36, 35) and is applied to the surface region (21) of the connection layer (20), and the solder layer (30) is arranged such that said solder layer, with the inner boundary (35) thereof, delimits lateral surface expansion of the connection layer (20), and at least one of the connection layer (20) and the solder layer (30) are thermally treated and the reinforcement layer (30') is formed between the connection layer (20) and the solder layer (30), wherein the formed reinforcement layer (30') has a higher modulus of elasticity than the connection layer (20) and wherein at least the solder layer (30) is transformed into the formed reinforcement layer (30') upon the thermal treating.

12. The joining method according to claim 11, wherein the reinforcement layer (30') is formed from a solder layer (30) containing tin, bismuth, zinc, gallium and/or aluminum.

13. The joining method according to claim 11, characterized in that the solder layer (30) is applied and/or disposed after the bonded connection of the at least one electric and/or electronic component (10) to the connection layer (20) has been formed.

14. The joining method according to claim 11, characterized in that the connection layer (20) is configured as a silver-sintered layer or silver-sintered molded part.

* * * * *